(12) United States Patent
Hauer et al.

(10) Patent No.: US 7,950,287 B2
(45) Date of Patent: May 31, 2011

(54) PRESSURE-SENSOR SYSTEM

(75) Inventors: Wolfgang Hauer, Aichelberg (DE);
Laszlo Szakacs, Szombathely (HU);
Hans-Martin Irslinger, Kusterdingen (DE); Richard Muehlheim, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 92 days.

(21) Appl. No.: 12/433,537

(22) Filed: Apr. 30, 2009

(65) Prior Publication Data
US 2009/0282926 A1 Nov. 19, 2009

(30) Foreign Application Priority Data

Apr. 30, 2008 (DE) .......................... 10 2008 001 509

(51) Int. Cl.
*G01L 7/00* (2006.01)

(52) U.S. Cl. ......................................... 73/756

(58) Field of Classification Search .................. None
See application file for complete search history.

(56) References Cited

U.S. PATENT DOCUMENTS

| 7,162,927 B1 * | 1/2007 | Selvan et al. ................... 73/753 |
| 2002/0029639 A1 * | 3/2002 | Wagner et al. .................. 73/756 |

* cited by examiner

*Primary Examiner* — Andre J Allen
(74) *Attorney, Agent, or Firm* — Kenyon & Kenyon LLP

(57) ABSTRACT

A pressure-sensor system having a sensor element and a hermetic housing for the sensor element has a particularly uncomplicated installation, in particular even under aggressive ambient conditions. The housing of this pressure-sensor system includes a first housing part having a housing bottom, and at least one additional housing part. The sensor element is installed on the housing bottom, and the pressure is supplied via an opening in the housing bottom. The at least one additional housing part is disposed above the sensor element and is connected to the first housing part. Apart from this, connecting pins for the electrical contacting of the sensor element are provided. The connecting pins are guided through the additional housing part.

12 Claims, 3 Drawing Sheets

PRESSURE-SENSOR SYSTEM

FIELD OF THE INVENTION

The present invention relates to a pressure-sensor system having a sensor element and a hermetic housing for the sensor element. The housing of this pressure-sensor system includes a first housing part having a housing bottom, and at least one additional housing part. The sensor element is installed on the housing bottom, and the pressure is supplied via an opening in the housing bottom. The at least one additional housing part is disposed above the sensor element and connected to the first housing part. Furthermore, the pressure-sensor system includes connecting pins for the electrical contacting of the sensor element.

BACKGROUND INFORMATION

Sensor systems are used for pressure detection in liquid and gaseous media, where they are frequently subjected to aggressive ambient conditions.

In this connection, the sensor element is disposed in a hermetic steel housing, which is made up of a relatively thick-walled base and a relatively thin-walled cover. Base and cover are welded together. An opening is formed in the base, above which the sensor element is installed. Together with a tube connector that connects to the outer side of the housing, this opening forms the hydraulic connection of the sensor system. The electrical connections are implemented in the form of connecting pins, which are likewise guided through the housing base and connected to the sensor element via bonding wires. Accordingly, the electrical connection of the known pressure-sensor system is located on the same housing side as the hydraulic connection.

For this concept, particular precautions must be taken to prevent the electrical connections from coming into contact with the measured medium and thus being chemically attacked. In practice, to this end, the hydraulic connection is extended using a small tube or the like, which is relatively complex in terms of construction and which requires additional components.

SUMMARY OF THE INVENTION

The present invention provides a pressure-sensor system of the type mentioned at the outset, which is distinguished by a particularly uncomplicated installation, in particular, even under aggressive ambient conditions.

According to the present invention, for this purpose, the connecting pins are guided through the additional housing part of the pressure-sensor system, while the pressure is applied via an opening in the housing bottom.

By disposing the connecting pins in this manner, the hydraulic connection and the electrical connection of the pressure-sensor system are formed on different sides of the housing. Therefore, the pressure-sensor system according to the present invention is provided with a hydraulic connection side and an electrical connection side that is separated from the hydraulic connection side. Additional construction elements for the spatial separation of the hydraulic and the electrical connections, such as a small tube for the pressure connection, are therefore unnecessary.

To construct a pressure-sensor system of the type mentioned at the outset, first the sensor element is installed on the housing bottom, namely above the pressure connection opening. Afterward, the other housing parts, such as a cover, are disposed above the sensor element, and connected to the first housing part in order to hermetically seal the housing. If the connecting pins are guided through the cover of the housing according to the present invention, then particular measures are necessary in order to produce an electrical connection between the sensor element and the connecting pins.

To this end, a preferred specific embodiment of the pressure-sensor system according to the present invention includes a circuit substrate, for example, in the form of a printed-circuit board, which is disposed together with the sensor element in the housing. In this variant, the electrical connections of the sensor element are guided to the circuit substrate. If the circuit substrate is installed on the housing bottom along with the sensor element, the electrical connections may simply be guided to the circuit substrate with the aid of bonding wires, before the housing is closed. Additional connecting means are provided for the electrical connection between the circuit substrate and the connecting pins in the housing cover.

In principle, there are different options for implementing an electrical connection between the connecting pins and such a circuit substrate, it being important to note that this connection is established only when the housing parts are joined together or the assembly achieves its final constructive form.

In a first variant, a flex foil is guided from the circuit substrate to the connecting pins as a connecting means. In this case, the electrical connection between the circuit substrate and the connecting pins is produced, i.e., the flex foil is installed, before the housing parts are joined together and mechanically connected to each other. In the process, the flex foil is then folded into the housing.

According to another variant of the present invention, a spring is used as electrical connecting means. The one end of such a spring engages with a connecting pin, and thus is also in electrical contact with the connecting pin. The other end of the spring is then pressed against a corresponding contact surface on the circuit substrate when the housing parts are assembled, thereby producing an electrical contact. For this purpose, as a rule the spring has to be fixed on at least one side. As a connecting means, a leaf spring is advantageously cemented or soldered to the connecting pin and/or to the contact surface, whereby a particularly low-resistance connection is produced.

In a particularly advantageous specific embodiment of the present invention, a spiral spring is used as a connecting means, which is dimensioned in accordance with the connecting pin. The one end of the spiral spring is slipped onto the connecting pin, thereby contacting the outer surface of the connecting pin in a form-locking manner. On the one hand, this press fit fixes the spiral spring, and on the other hand, it produces the electrical contact. The free spring end is pressed against the contact surface on the circuit substrate during assembly of the housing parts. In the process, the spiral spring is compressed over the connecting pin, so that the connecting pin functions as a guide for the spiral spring.

Apart from being used for re-contacting, the circuit substrate may also advantageously be used for disposing additional circuit parts or elements, in particular an EMC capacitor, within the housing. Apart from this, contact surfaces, e.g., needle contact surfaces, may be formed on the circuit substrate for a sensor adjustment. In this case, a sensor adjustment may be performed even before the assembly or closure of the housing, that is, on a lower level of value creation, which means that the number of connecting pins may be reduced.

The use of a metallic housing, in particular of steel, for the pressure-sensor system according to the present invention, proves to be advantageous in several regards. The metallic surface of the housing bottom allows for the sensor element to be installed by soldering or welding. The high-strength connection that results in the process withstands well even the tensile loads that normally occur under the effect of pressure. Apart from this, a reliable, leak-proof connection between the individual housing parts may be produced simply by soldering or welding. In this context, a defined reference pressure, such as a vacuum, for example, may be enclosed in the housing.

DETAILED DESCRIPTION

Figure 1:
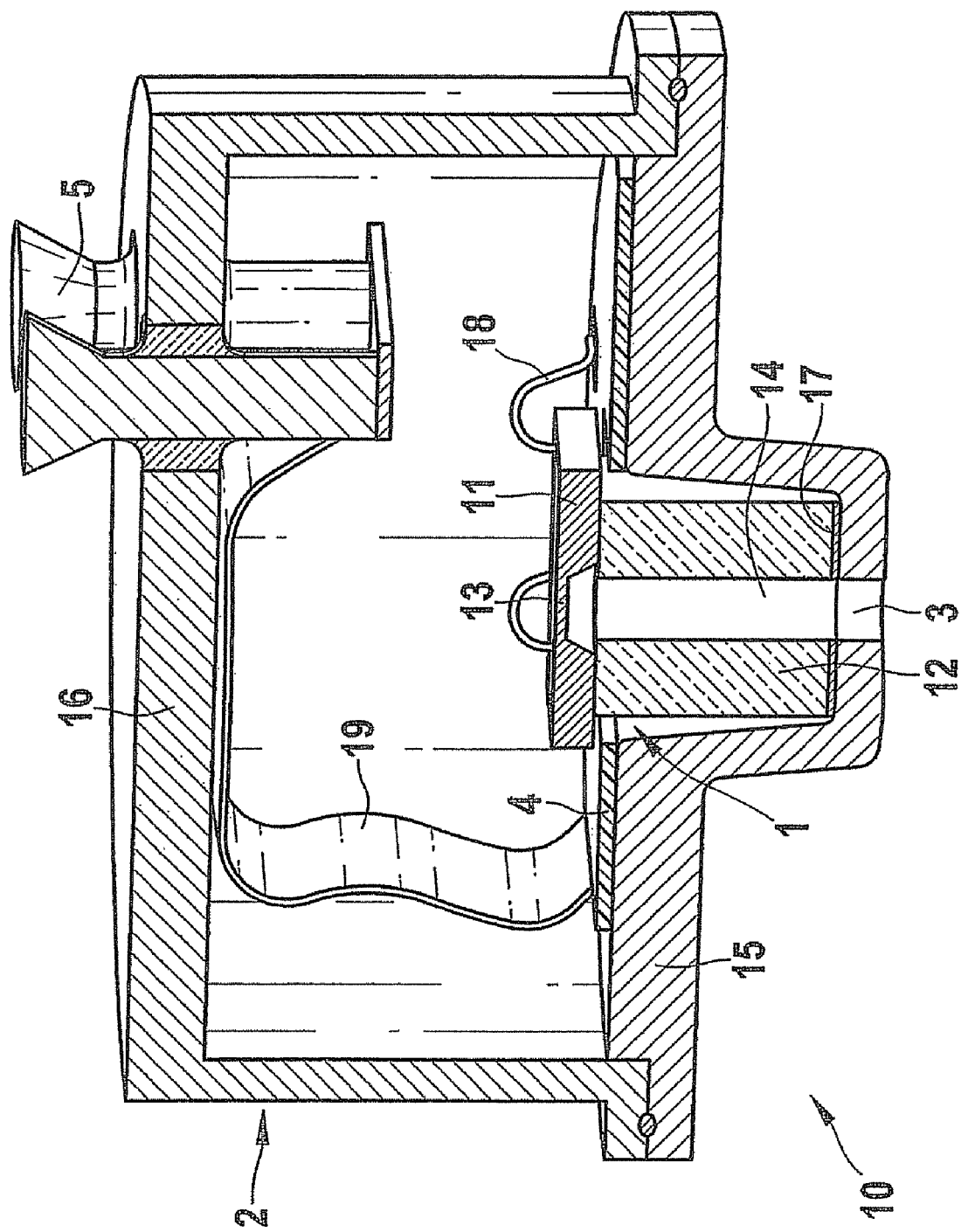
FIG. 1 shows a schematic sectional view of a first specific embodiment of a pressure-sensor system according to the present invention.

Pressure-sensor system 10 shown in FIG. 1 includes a sensor element 1 in the form of a sensor chip 11 having a glass base 12. A diaphragm 13 is formed in sensor chip 11, which diaphragm 13 is acted upon by pressure via a pressure supply opening 14 in glass base 12. Sensor element 1 is disposed in a hermetically sealed steel housing 2, which in the exemplary embodiment shown here is made up of a housing bottom 15 and a cover 16 as an additional housing part. In housing bottom 15, a recess 17 is formed as an installation surface for sensor element 1. An opening 3 is located in the bottom region of recess 17. Glass base 12 of sensor element 1 is disposed and soldered in this recess 17, so that pressure supply opening 14 is situated above opening 3 in housing bottom 15. Accordingly, housing bottom 15 forms the hydraulic connection side of pressure-sensor system 10. However, the interior of housing 2 is hermetically sealed due to the pressure-resistant installation of sensor element 1 above opening 3.

Apart from this, a printed-circuit board 4 is disposed on housing bottom 15, which is used for re-contacting sensor element 1. For this purpose, the electrical connections of sensor element 1 are guided to printed-circuit board 4 with the aid of bonding wires 18. Cover 16 of housing 2 is disposed above sensor element 1 and printed-circuit board 4, and welded to housing bottom 15.

According to the present invention, connecting pins 5 for the electrical contacting of sensor element 1 are guided outside through cover 16. To this end, connecting pins 5 were glazed in a pressure-resistant manner. In this instance, the electrical connection between connecting pins 5 and printed-circuit board 4 is produced with the aid of a flex foil 19, which is guided from printed-circuit board 4 to connecting pins 5. Prior to the assembly of the two housing parts 15 and 16, this flex foil 19 was on the one hand connected to printed-circuit 4 and on the other hand to connecting pins 5, and during the joining of the two housing parts 15 and 16, it was folded inside housing 2, which is illustrated by FIG. 1.

Figure 2:
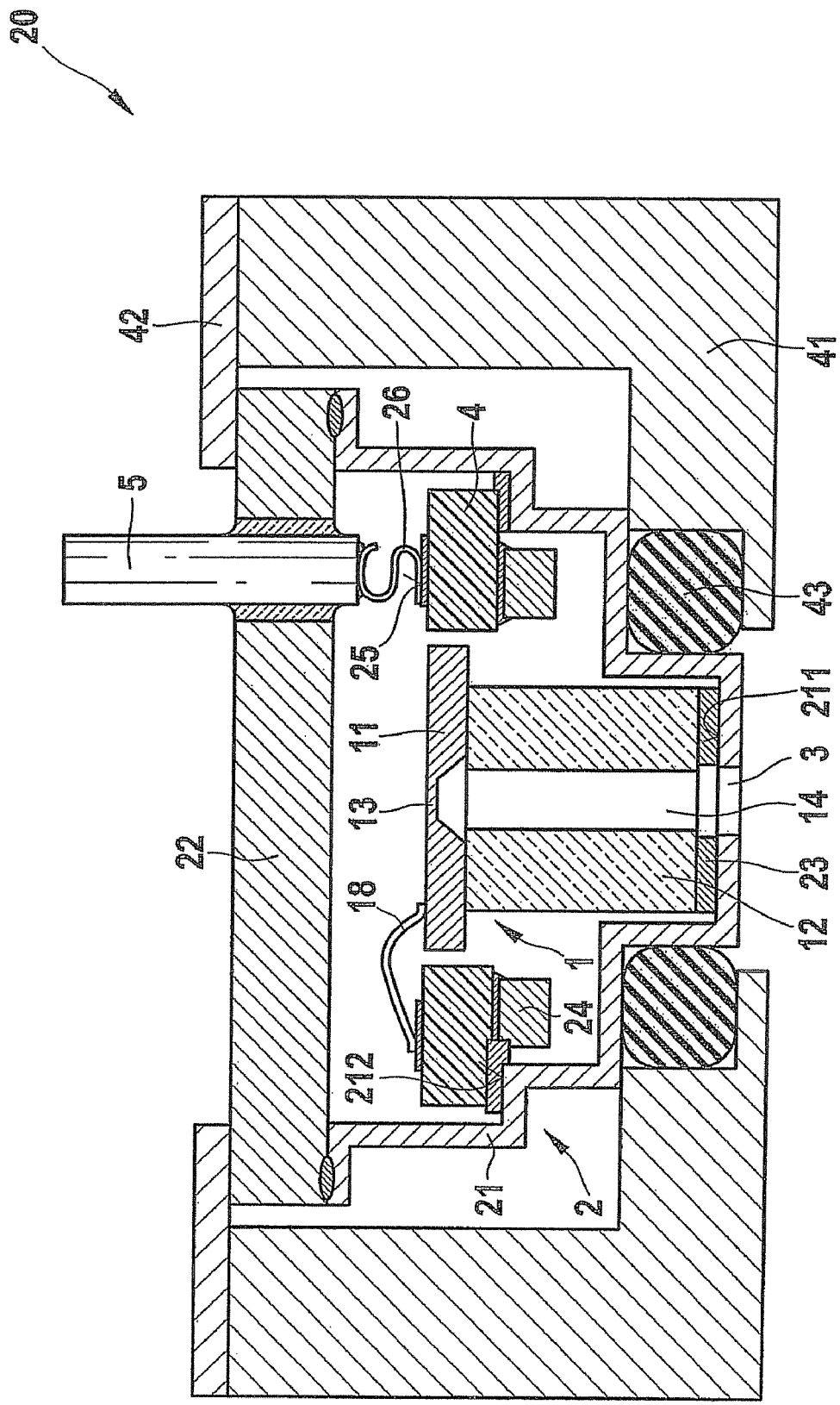
FIG. 2 shows a schematic sectional view of a second specific embodiment of a pressure-sensor system according to the present invention.

The variant of a pressure-sensor system 20 according to the present invention shown in FIG. 2 also includes a sensor element 1 having a pressure sensor chip 11 on a glass base 12, which is disposed in a hermetically sealed steel housing 2. This housing 2 is made up of two housing parts 21 and 22. Bottom region 211 of first housing part 21 is designed as an installation surface for sensor element 1, and has an opening 3 for applying pressure to sensor diaphragm 13. Glass base 12 of sensor element 1 is connected to installation surface 211 in a pressure-resistant manner via a soldered connection 23, so that pressure may be applied to sensor diaphragm 13 via opening 3 in first housing part 21 and via pressure supply opening 14 of glass base 12.

Apart from this, an installation surface 212 for a printed-circuit board 4 is designed in first housing part 21. The electrical connections of sensor element 1 are guided via bonding wires 18 to printed-circuit board 4, where they also may already be connected to additional circuit elements. Thus, in the exemplary embodiment shown here, printed-circuit board 4 functions as a substrate for an EMC 24. Furthermore, a contact surface 25 is formed on printed-circuit board 4.

Second housing part 22 forms a cover, which is disposed above sensor element 1 and printed-circuit board 4, and welded to first housing part 21. Through holes are formed in this cover 22, into which connecting pins 5 for the electrical contacting of sensor element 1 are glazed. A leaf spring 26 is soldered onto the end of a connecting pin 5 that projects into the interior of the housing. During the assembly of the two housing parts 21 and 22, this leaf spring 26 is pressed against contact surface 25 on printed-circuit board 4, which is shown in FIG. 2. An electrical connection between connecting pin 5 and printed-circuit board 4 is thus produced, via which sensor element 1 is electrically contacted.

FIG. 2 shows pressure-sensor system 20 in an application as a transmission pressure sensor. In this instance, pressure-sensor system 20 is installed between base plate 41 and hydraulic plate 42 of a transmission. The hydraulic connecting side of pressure-sensor system 20 is installed in a pressure-resistant manner with the aid of a high-pressure seal 43 on hydraulic plate 42, on which the measured pressure or the measured medium is applied. Due to the structural concept according to the present invention, the electrical connecting side of pressure-sensor system 20 faces opposite base plate 41. Accordingly, in the installed state, connecting pins 5 may be accessed only from base plate 41, where they cannot come into contact with the measured medium. The structural concept according to the present invention thus allows for a simple spatial separation between the hydraulic and the electrical connecting sides in the application.

Figure 3:
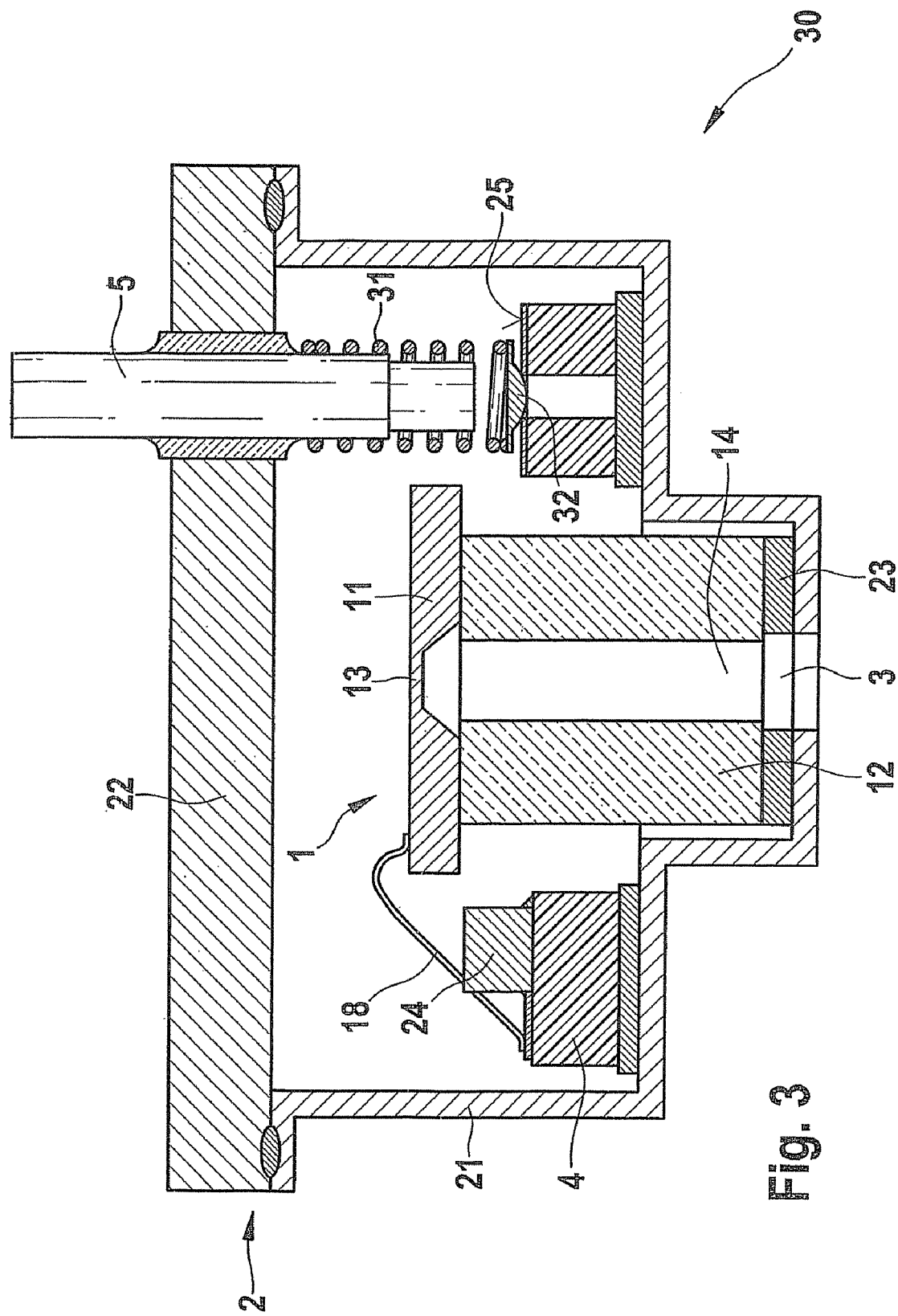
FIG. 3 shows a schematic sectional view of a third specific embodiment of a pressure-sensor system according to the present invention.

The structure of pressure-sensor system 30 shown in FIG. 3 corresponds to a large extent to that of pressure-sensor system 20 in FIG. 2, except for the contacting of connecting pins 5. In the case of pressure-sensor system 30, a contact surface 25 is likewise formed on printed-circuit board 4 disposed in housing 2. However, in this instance the electrical connection between connecting pin 5 and printed-circuit board 4 is produced with the aid of a spiral spring 31, which is slipped onto connecting pin 5 and fixed on its upper end to connecting pin 5 in a press fit. A contact region 32 is formed on the lower free flexible end of spiral spring 31, which contact region 32 is pressed against contact surface 25 on printed-circuit board 4 during the assembly of the two housing parts 21 and 22. Thus, an electrical connection between connecting pin 5 and printed-circuit board 4 is produced, via which sensor element 1 is ultimately contacted. In this variant, connecting pin 5 is thus also used as a support and guide for spiral spring 31, in that it fixes spiral spring 31 and absorbs the lateral force occurring during the compression, in order to avoid a buckling.

What is claimed is:

1. A pressure-sensor system, comprising:
   a hermetic housing including a first housing part having a housing bottom, and at least one additional housing part;

a sensor element situated on the housing bottom, pressure being supplied via an opening in the housing bottom, the additional housing part being situated above the sensor element and being connected to the first housing part; and connecting pins for electrical contacting of the sensor element, the connecting pins being guided through the additional housing part;

a circuit substrate situated in the housing, electrical connections of the sensor element being guided to the circuit substrate; and an arrangement for producing an electrical connection between the connecting pins and the circuit substrate;

wherein the arrangement for producing includes a flex foil guided from the circuit substrate to the connecting pins.

2. A pressure-sensor system, comprising:

a hermetic housing including a first housing part having a housing bottom, and at least one additional housing part;

a sensor element situated on the housing bottom, pressure being supplied via an opening in the housing bottom, the additional housing part being situated above the sensor element and being connected to the first housing part; and connecting pins for electrical contacting of the sensor element, the connecting pins being guided through the additional housing part;

a circuit substrate situated in the housing, electrical connections of the sensor element being guided to the circuit substrate; and an arrangement for producing an electrical connection between the connecting pins and the circuit substrate;

wherein at least one contact surface for a spring is formed on the circuit substrate, the contact surface being used for connecting a connecting pin.

3. The pressure-sensor system according to claim 2, wherein the spring is implemented in the form of a leaf spring, which is connected, including cemented or soldered, to at least one of the connecting pin and the contact surface.

4. The pressure-sensor system according to claim 2, wherein the spring is implemented in the form of a spiral spring whose one end is slipped onto the connecting pin and whose other end rests on the contact surface.

5. The pressure-sensor system according to claim 2, wherein at least one additional circuit element, including an EMC capacitor, is situated on the circuit substrate.

6. The pressure-sensor system according to claim 2, wherein contact surfaces for a sensor adjustment are situated on the circuit substrate.

7. The pressure-sensor system according to claim 2, wherein the first housing part having the housing bottom, and the additional housing part are made of steel and soldered or welded to each other.

8. The pressure-sensor system according to claim 2, wherein a defined reference pressure prevails in the housing.

9. The pressure-sensor system according to claim 1, wherein at least one additional circuit element, including an EMC capacitor, is situated on the circuit substrate.

10. The pressure-sensor system according to claim 1, wherein contact surfaces for a sensor adjustment are situated on the circuit substrate.

11. The pressure-sensor system according to claim 1, wherein the first housing part having the housing bottom, and the additional housing part are made of steel and soldered or welded to each other.

12. The pressure-sensor system according to claim 1, wherein a defined reference pressure prevails in the housing.

* * * * *